(12) United States Patent
Feng et al.

(10) Patent No.: US 10,112,311 B2
(45) Date of Patent: Oct. 30, 2018

(54) ROTARY JOINT OF A ROBOT AND THE ROBOT INCLUDING THE SAME

(71) Applicant: ABB Schweiz AG, Baden (CH)

(72) Inventors: Tao Feng, Shanghai (CN); Kaiyuan Cao, Shanghai (CN); Yun Ha, Shanghai (CN)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/166,126

(22) Filed: May 26, 2016

(65) Prior Publication Data

US 2016/0271808 A1    Sep. 22, 2016

Related U.S. Application Data

(63) Continuation of application No. PCT/CN2013/088020, filed on Nov. 28, 2013.

(51) Int. Cl.
| | |
|---|---|
| *H01R 3/00* | (2006.01) |
| *B25J 19/00* | (2006.01) |
| *H01R 12/61* | (2011.01) |
| *H01R 35/02* | (2006.01) |
| *H05K 1/18* | (2006.01) |
| *H05K 3/34* | (2006.01) |

(52) U.S. Cl.
CPC .......... *B25J 19/0041* (2013.01); *H01R 12/61* (2013.01); *H01R 35/025* (2013.01); *H05K 1/189* (2013.01); *H05K 3/3405* (2013.01); *H05K 2201/10287* (2013.01)

(58) Field of Classification Search
CPC . B60R 16/027; B60C 23/0467; H01R 35/025; H01R 43/24

USPC ..................... 439/15–16, 164, 604
See application file for complete search history.

(56) References Cited

U.S. PATENT DOCUMENTS

| | | | |
|---|---|---|---|
| 5,384,431 A | 1/1995 | Tusques | |
| 5,827,081 A | 10/1998 | Sakamaki | |
| 6,551,113 B1 * | 4/2003 | Nishiyama | H01R 12/79 |
| | | | 439/67 |
| 2010/0237178 A1 | 9/2010 | Nakamura et al. | |

FOREIGN PATENT DOCUMENTS

| | | |
|---|---|---|
| CN | 101003132 A | 7/2007 |
| CN | 101716765 A | 6/2010 |
| CN | 103029138 A | 9/2012 |

(Continued)

OTHER PUBLICATIONS

International Search Report, PCT/CN2013/088020, ABB Technology Ltd. et al., dated Apr. 3, 2014

(Continued)

*Primary Examiner* — Thanh Tam Le
(74) *Attorney, Agent, or Firm* — Taft Stettinus & Hollister LLP (57) ABSTRACT

Disclosed is a wiring unit having a main portion of a flexible printed circuit (FPC) board therein. Said rotary joint further comprises a protective unit fixed to said wiring unit, in which an end portion of said FPC board is connected to a group of cables. Also disclosed is a robot comprising said rotary joint. Compared with the existing prior arts, the proposed solutions prevent the damage of FPC during assembly and/or disassembly of robots, while not losing compactness.

20 Claims, 10 Drawing Sheets

(56) References Cited

FOREIGN PATENT DOCUMENTS

| | | |
|---|---|---|
| CN | 102802886 A | 11/2012 |
| CN | 10356877 A | 4/2013 |
| CN | 10358320 A | 10/2013 |
| DE | 102011051733 A1 | 2/2012 |
| DE | 102012102245 A1 | 9/2012 |
| GB | 2164506 A | 3/1986 |
| JP | 2003071773 A | 3/2003 |
| JP | 200964479 A | 3/2009 |
| JP | 2010214530 A | 9/2010 |
| JP | 2011194520 A | 10/2011 |
| JP | 201235372 A | 2/2012 |
| JP | 201251045 A | 3/2012 |
| WO | 2014201606 A1 | 12/2014 |

OTHER PUBLICATIONS

Written Opinion PCT/CN2013/088020, ABB Technology Ltd. et al., dated Apr. 3, 2014.
First Office Action, Chinese Patent Application No. 201380080220.3, dated Oct. 28, 2016, 14 pages including English Translation.
Second Office Action, Chinese Patent Application No. 201380080220.3, dated Apr. 20, 2017, 17 pages including English Translation.
Extended European Search Report dated Jan. 31, 2018 in corresponding European application No. 13898080.0 (7 pages).

* cited by examiner

ROTARY JOINT OF A ROBOT AND THE ROBOT INCLUDING THE SAME

FIELD OF THE INVENTION

This invention generally relates to robot, and particularly relates to a rotary joint of robot, which includes a wiring unit employing flexible printed circuit (FPC) board.

BACKGROUND OF THE INVENTION

For industrial robots, especially the ones designed to work in limited and complex workspaces, flexibility and compactness are among the major design requirements, and cable routing plays a more and more important role in the applications of robots.

A robot typically comprises one or more rotary joints in order to achieve flexible positioning of robot arms. Generally, the larger the rotation ranges of rotary joints are, the more flexible a robot is. However, in order to transmit power and various signals to and from robot arms, one or more cables typically go through each rotary joint, and these cables cannot bear too much bending and twisting for a long time, which has become one of the major difficulties for large rotation ranges of rotary joints.

In traditional ways, cables or dress packs are routed outside robots, to give the space for cables' bending and prevent them from wearing out. But it will lead to lots of problems. For example, the explosion of robot cables, which are made by common materials, is fatal to vacuum environment of modern cleanrooms, since the out-gassing of cables will pollute the whole workspace and also the products therein. Issues also happen in traditional fields: robots, especially the ones with unprotected robot cables, for machine tending will also suffer from the corrosive cutting fluid, and leads to the reduction of the lifetime of robots and productivity of the plants.

Routing all the wires inside the robot is a new trend nowadays. But due to the limited inner space and requirements of the large bending radius, such kind routing is quite difficult and usually the working ranges of single joints are limited by cable routing rather than other mechanism structures.

Various attempts have been made to solve the problem of routing in limited spaces, and one of the successful solutions is using new materials, such as FPC. Less space needed and longer lifetime makes FPC a preferable routing solution. But due to its nature material characters, FPC is easy to be damaged during the assembly and running of robots, because of contacting projections, sharp edges, burrs, fins, and etc. The insulation on conductors may be abraded, or the FPC could be cut, especially when strain relief structure is not available.

So protections should be adopted when FPC is used in robots.

To wiring through a joint, FPC usually consists two parts: the moving one and the fixed one. In practices, more attentions are paid to the protection of the former one.

Figure 1A:
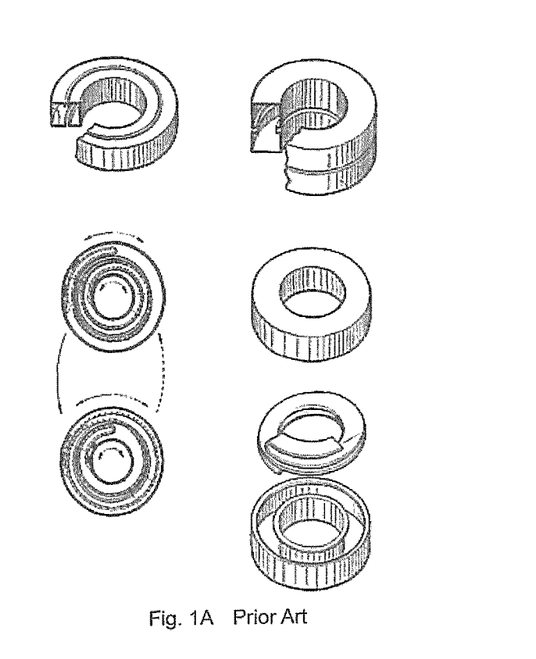
FIG. 1A and FIG. 1B show the conventional protection structures of FPC in the rotary joint, respectively.

To prevent the moving FPC from wearing out by other structures, as shown in FIG. 1A, GB2164506A uses a box which consists of two relatively rotating members to limit the space for FPC and provides smooth contacting surfaces. Following this idea, protections for the moving parts of FPC are extended in JP2009-64479 and JP2012-51045. By adopting such solutions, moving FPC could be well protected. But the fixed parts of FPC could still be damage during assembly.

Figure 1B:
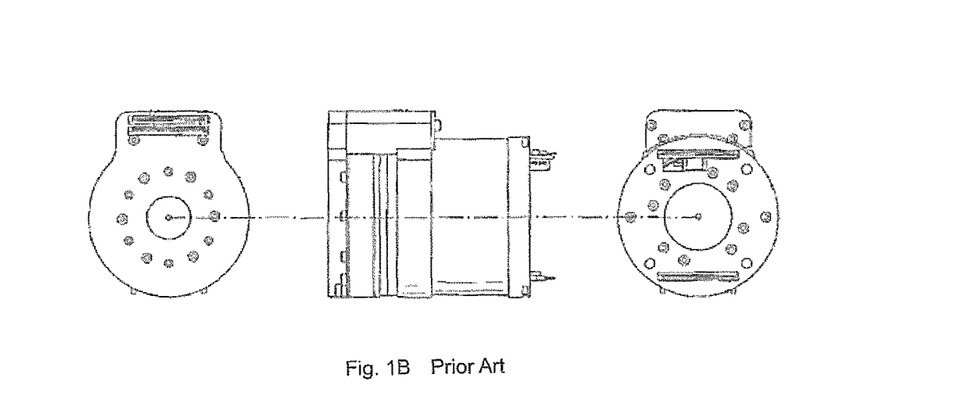

To give better protection for FPC, DE102011051733 and JP2012035372A try to restrain the whole FPC inside a box by positioning all the connectors on both side of it, as shown in FIG. 1B. This solution is adoptable only when the number of wires of power and signal are limited, otherwise arranging lots of pins or connectors on a single box requires large space, and thus the box will be too big for small and compact robot.

In view of the foregoing, there is a need in the art to develop an improved rotary joint and an improved routing structure.

SUMMARY OF THE INVENTION

The objects of the present invention are achieved by a rotary joint of a robot and the robot including the same, in order to provide better solution for FPC while not losing compactness.

According to one aspect of the invention, a rotary joint comprises a wiring unit having a main portion of a FPC board therein. Said rotary joint further comprises a protective unit fixed to said wiring unit, in which an end portion of said FPC board is connected to a group of cables.

According to a preferred embodiment of the present invention, said end portion of said FPC board is fixed to said protective unit.

According to a preferred embodiment of the present invention, said protective unit comprises a connecting member and a plastic board coupling to each other, said connecting member being fixed to said wiring unit, said plastic board being fixed to said end portion of said FPC board.

According to a preferred embodiment of the present invention, said protective unit comprises a plurality of plastic boards, which substantially parallel or horizontal to each other, thereby a plurality of said end portion of said FPC boards are apart from each other and capable of connecting to corresponding groups of cables, respectively.

According to a preferred embodiment of the present invention, said connecting member has a box like shape without the upper surface, being capable of accommodating said plastic board, and having an opening on the side surface for said cables to pass through.

According to a preferred embodiment of the present invention, the end portion of said plastic board is an arc like shape.

According to a preferred embodiment of the present invention, said protective unit further comprises one or more screws and/or one or more snap hooks, thereby fixing said plastic board to said connecting member.

According to a preferred embodiment of the present invention, said plastic board is vertical or inclined to said wiring unit.

According to a preferred embodiment of the present invention, said cables are soldered to said end portion of said FPC board, a protection membrane and/or a reinforcement membrane being put on the area where said cables soldered, said protection membrane and/or reinforcement membrane being fixed to said plastic board.

According to a preferred embodiment of the present invention, said protection membrane is a kind of glue.

According to a preferred embodiment of the present invention, a soft or hard reinforcing layer is on one or two sides of said FPC board, said reinforcing layer being fixed to said plastic board.

According to a preferred embodiment of the present invention, said reinforcing layer is partly or completely fixed on said FPC board by adhesive or tape.

According to a preferred embodiment of the present invention, said protective unit further comprises one or more clamps, to fix said cables to said protective unit.

According to a preferred embodiment of the present invention, said protective unit further comprises one or more knots inside said protective unit, to prevent said cables from being pulled out.

According to a preferred embodiment of the present invention, said protective unit further comprises melt adhesive filled into said protective unit.

According to a preferred embodiment of the present invention, said wiring unit comprises a first rotation member and a second rotation member rotatable relative to each other, and a first portion of said main portion of said FPC board is connected to said first rotation member and a second portion of said main portion of said FPC board is connected to said second rotation member.

According to a preferred embodiment of the present invention, said first rotation member is provided with a hole, and said first portion of said main portion of said FPC board is wound around the hole loosely enough to allow itself to move relative to said second portion of said main portion of said FPC board.

According to another aspect of the invention, a robot comprises the rotary joint.

Other features and advantages of embodiments of the present application will also be understood from the following description of specific exemplary embodiments when read in conjunction with the accompanying drawings, which illustrate, by way of example, the principles of the invention.

Compared with the existing prior arts, the solution of the present invention has at least the following advantages:

(1) Better protection for FPC: The worn-out and high voltage breakdown between FPC and robot links could be avoided.

(2) Easy for assembly: No strengthen force will be applied on FPC, and FPC will not be cut by sharp edges, burrs, fins, and the like, during robot assembly.

(3) Saving space: Comparing with placing connectors on FPC box, like the solution of DE102011051733, placing plastic boards and cables on FPC box requires much less space, and the routing structure could be much more flexible and compact.

(4) Low cost: the usage of expensive flexible cables could be avoided, and size of routing structure could be minimized.

BRIEF DESCRIPTION OF THE DRAWINGS

The subject matter of the invention will be explained in more details in the following description with reference to preferred exemplary embodiments which are illustrated in the drawings, in which.

DETAILED DESCRIPTION OF PREFERRED EMBODIMENTS

Exemplary embodiments of the present invention are described in conjunction with the accompanying drawings hereinafter. For the sake of clarity and conciseness, not all the features of actual implementations are described in the specification.

In general, embodiments of the present application provide a new rotary joint. As will be apparent from the further discussions below, one or more FPC boards are employed to provide a wiring unit, and a protective unit is also provided.

A FPC board typically refers to a circuit or wiring structure mounted on a flexible plastic substrate, such as polyimide or polyester film. A type of FPC board contains one or more printed wires for interconnecting electronic components or electronic assemblies either directly or by means of connectors. A FPC board can be as thin as 0.1 mm and can be bent with a bending radius of as small as 1 mm.

Throughout the descriptions of various embodiments of the present application, repeated descriptions of some similar elements will be omitted.

Figure 2:
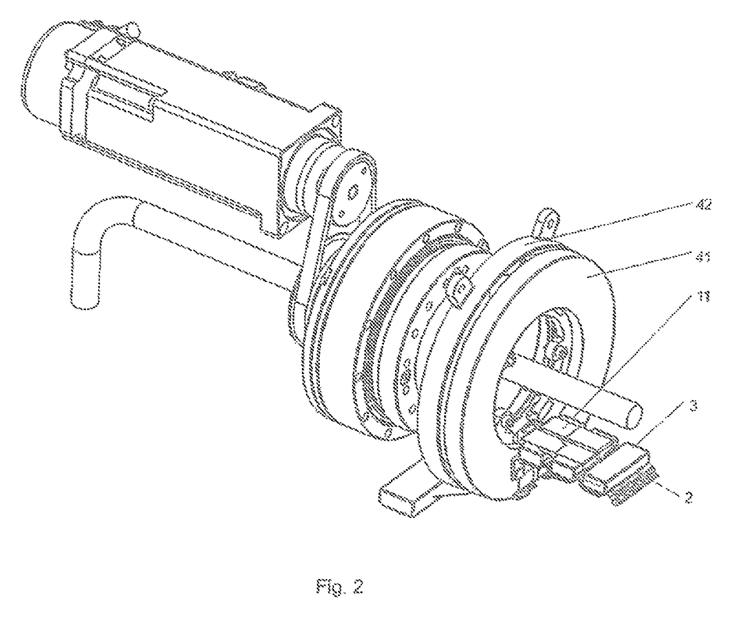
FIG. 2 shows a perspective view of the rotary joint comprising a plurality FPC boards according to an embodiment of the present invention.

According to one preferred embodiment, a rotary joint of a robot comprising a plurality FPC boards is shown in FIG. 2, comprises a wiring unit 4 having a main portion 12 of a FPC board 11 therein, and the rotary joint further comprises a protective unit 3 fixed to the wiring unit 4, in which an end portion of the FPC board 11 is connected to a group of cables 2. All the FPC boards are converted into traditional cables by fixing FPC boards to cables. By this way, routing inside robot links with FPC directly could be avoided, and the usage of expansive flexible raw cable is unnecessary as well.

It is noted that the first and second rotation members 41 and 42 may alternatively be directly connected to the first and second portions, respectively. The first and second rotation members 41 and 42 may be connected to the first and second portions, respectively, at any locations on the first and second portions.

Due to the structure of the wiring units, the wiring units 4 can be structured to have a through hole at the centre, to allow other components to pass through. Said first rotation member 41 is provided with a hole, and said first portion of said main portion 12 of said FPC board is wound around the hole loosely enough to allow itself to move relative to said second portion of said main portion 12 of said FPC board.

Reference is now made to FIG. 2, which show the wiring unit 4 in which the first rotation member 41 is capable of being rotated counterclockwise and clockwise with respect to the second rotation member 42 according to an embodiment of the present application.

FIGS. 3-8 show one embodiment of a rotary joint with a protection unit of a FPC board according to present application.

The rotary joint of a robot comprising a plurality FPC boards 11, comprises a wiring unit 4 having a main portion 12 of a FPC board 11 therein, and the rotary joint further comprises a protective unit 3 fixed to the wiring unit 4, in which an end portion of the FPC board 11 is connected to a group of cables 2. The protective unit 3 is designed on the wiring unit 4 to fix all the leading-out of FPC boards 11. The protective unit 3 comprises a connecting member 31 and a plastic board 32 coupling to each other, the connecting member 31 being fixed to the wiring unit 4, and the plastic board 32 being fixed to the end portion of the FPC board 11.

The protective unit 3 may comprise a plurality of plastic boards 32, which substantially parallel to each other and inclined to the wiring unit 4, thereby a plurality of the end portion of the FPC boards 11 are apart from each other and capable of connecting to corresponding groups of cables 2, respectively.

Figure 3:
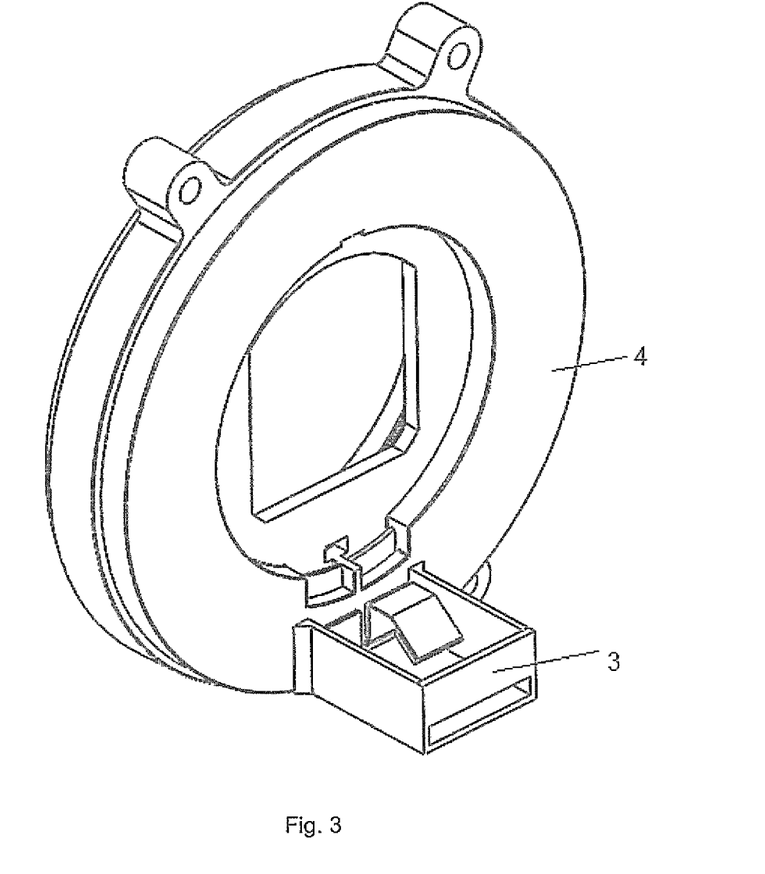
FIG. 3 shows a perspective view of the wiring unit and the protection unit according to an embodiment of the present invention.
Figure 4:
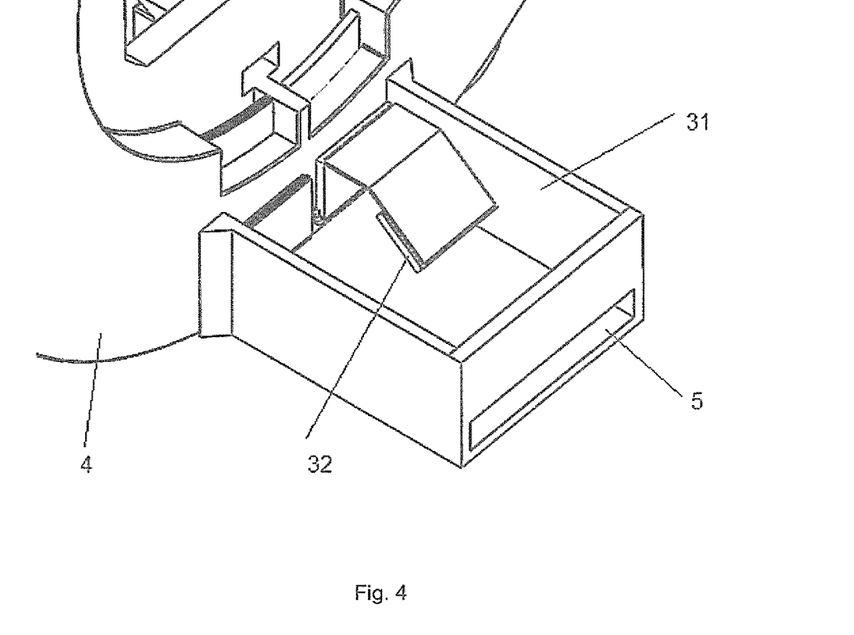
FIG. 4 shows a perspective view of the protection unit according to an embodiment of the present invention.

The connecting member 31 may have a box like shape without the upper surface, being capable of accommodating the plastic board 32, and having an opening 5 on the side surface for the cables 2 to pass through.

To better fix the FPC 11 and the cables 2, the protective unit 3 may further comprise one or more clamps, to fix the cables 2 to itself. The protective unit 3 may further comprise one or more knots inside itself, to prevent the cables 2 from being pulled out. The protective unit 3 may comprises melt adhesive filled into itself.

Figure 5:
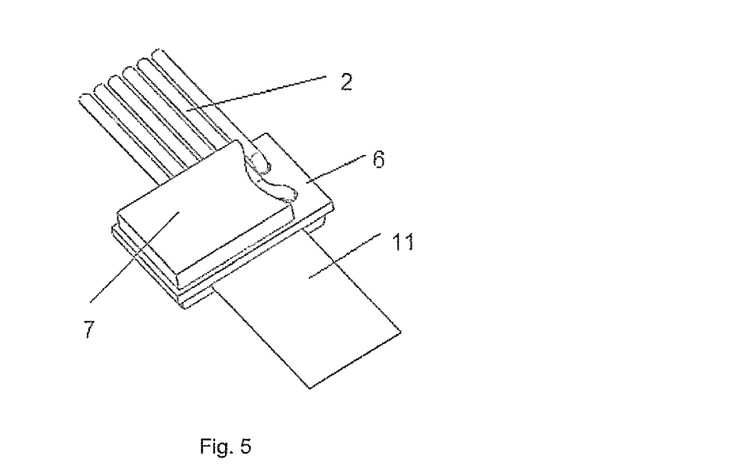
FIG. 5 shows a FPC board with reinforcing layer according to an embodiment of the present invention.

As shown in FIG. 5, the cables 2 are fixed on the FPC board 11, then the protection material 7 is put on the area where the cable 2 fixed. The FPC 11 can have a reinforcement layer 6 for fixing the cable 2. The cable 2 can be soldered to FPC 11. The protection material 7 can be kind of glue.

Figure 6:
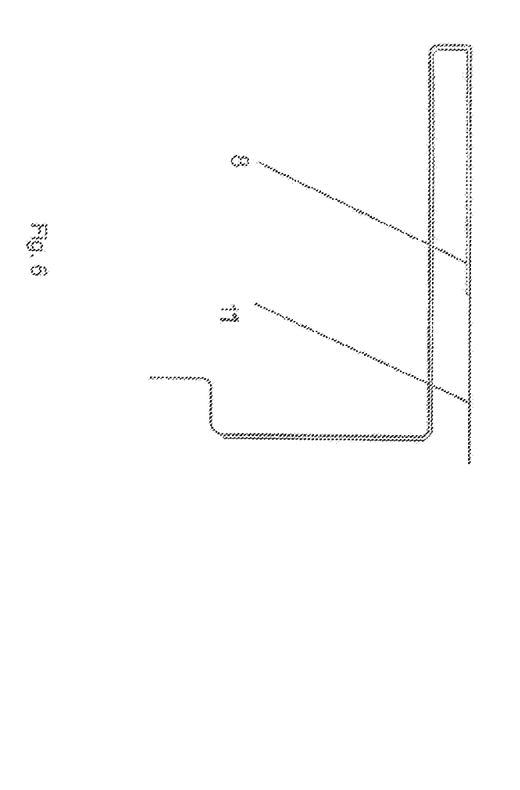
FIG. 6 shows a perspective view of FPC board soldered to the cables according to an embodiment of the present invention.
Figure 7A:
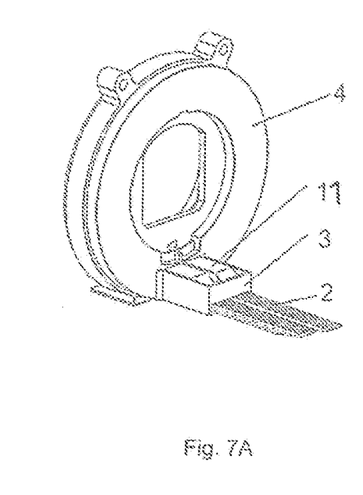
FIG. 7A shows a perspective view of the wiring unit and the protection unit comprising a plurality FPC boards according to an embodiment of the present invention.
Figure 7B:
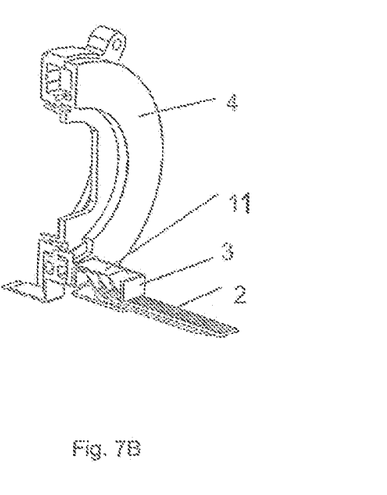
FIG. 7B shows a section view of the wiring unit and the protection unit comprising a plurality FPC boards according to an embodiment of the present invention.
Figure 8:
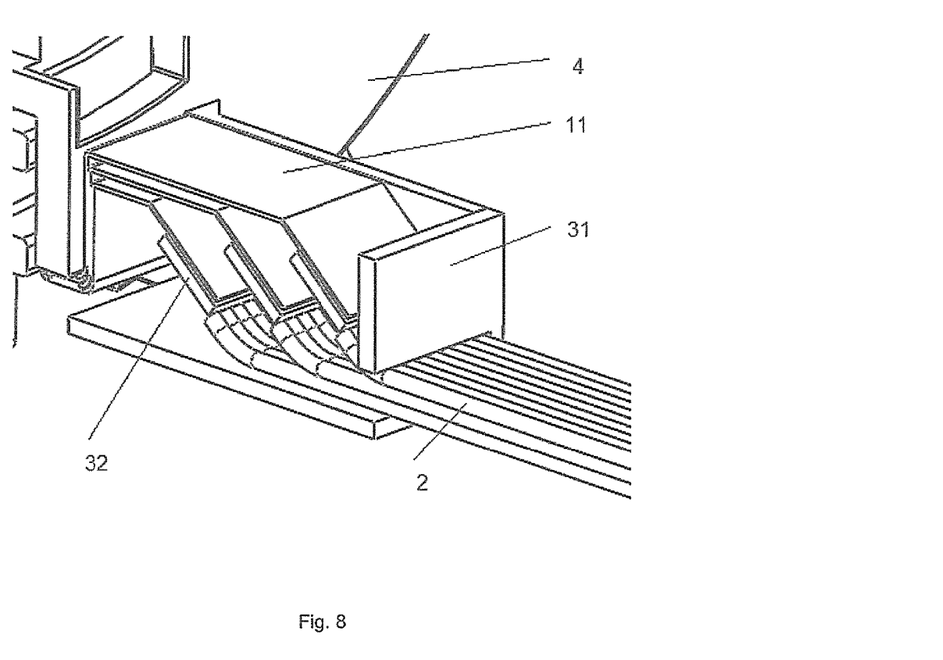
FIG. 8 shows a section view of the protection unit comprising a plurality FPC boards according to an embodiment of the present invention.

As shown in FIG. 6, a reinforcing layer 8 is put outside FPC 11. The reinforcing layer 8 can in one side or both sides of FPC 11. The reinforcing layer 8 can be partly or completely fixed on FPC 11. The reinforcing Layer 8 can be soft or hard material. The solution to fix the reinforcing layer 8 on FPC 11 is using adhesive or tape. Reinforcing layer 8 used in this strain relief structure has the following two advantages: to increase FPC strength and avoid damage on FPC when robot assembly and disassembly; and to increase the insulation voltage between FPC and FPC, FPC and surrounding parts.

In an embodiment of the present application, the wiring unit may further comprise one or more FPC boards stacked together with the FPC board(s) as described above and bent together with the FPC board(s) as described above. In other words, the FPC boards are arranged on top of one another to form a layered structure and are bent at one or more common bending portions. During operation, the FPC boards moves together in the same manner as a single FPC board.

In an embodiment of the present application, one or more of the further FPC boards carry no active signals during operation. Such FPC boards may be referred to as inactive FPC boards. When these inactive FPC boards are arranged at the top layers or bottom layers of the layered structure, they serve as protections for the active FPC boards which carry active signals arranged at the inner layers of the layered structure.

The above describes one kind of protection unit structure employing FPC boards, but the structures of protection unit employing FPC boards are not limited to the above, and it can also adopt, but not limited to, other structures as described below.

FIGS. 9-12 show another embodiment of a rotary joint with a protection unit of a FPC board according to present application.

The rotary joint of a robot comprising a plurality FPC boards 11, comprises a wiring unit 4 having a main portion 12 of a FPC board 11 therein, and the rotary joint further comprises a protective unit 3 fixed to the wiring unit 4, in which an end portion of the FPC board 11 is connected to a group of cables 2. The protective unit 3 is designed on the wiring unit 4 to fix all the leading-out of FPC boards 11. The protective unit 3 comprises a connecting member 31 and a plastic board 32 coupling to each other, the connecting member 31 being fixed to the wiring unit 4, and the plastic board 32 being fixed to the end portion of the FPC board 11.

Figure 9:
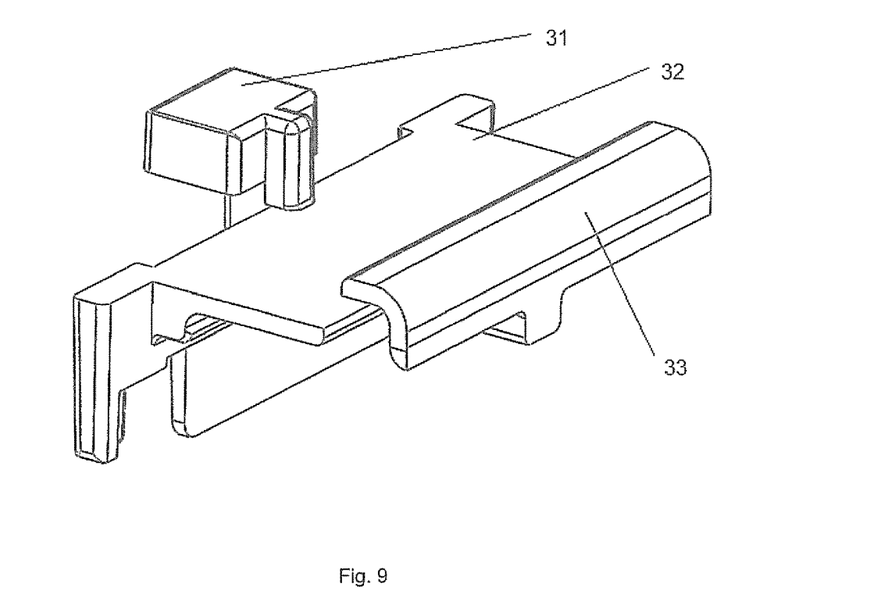
FIG. 9 shows a perspective view of the plastic board according to an embodiment of the present invention.

The end portion 33 of the plastic board is an arc like shape.

Figure 10:
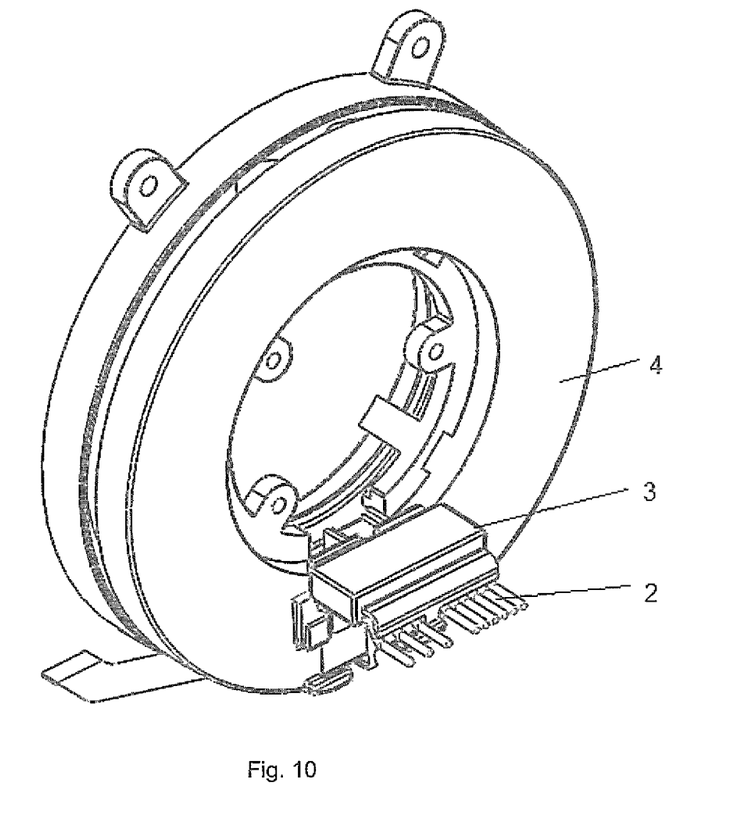
FIG. 10 shows a perspective view of the wiring unit and the protection unit according to an embodiment of the present invention.
Figure 11:
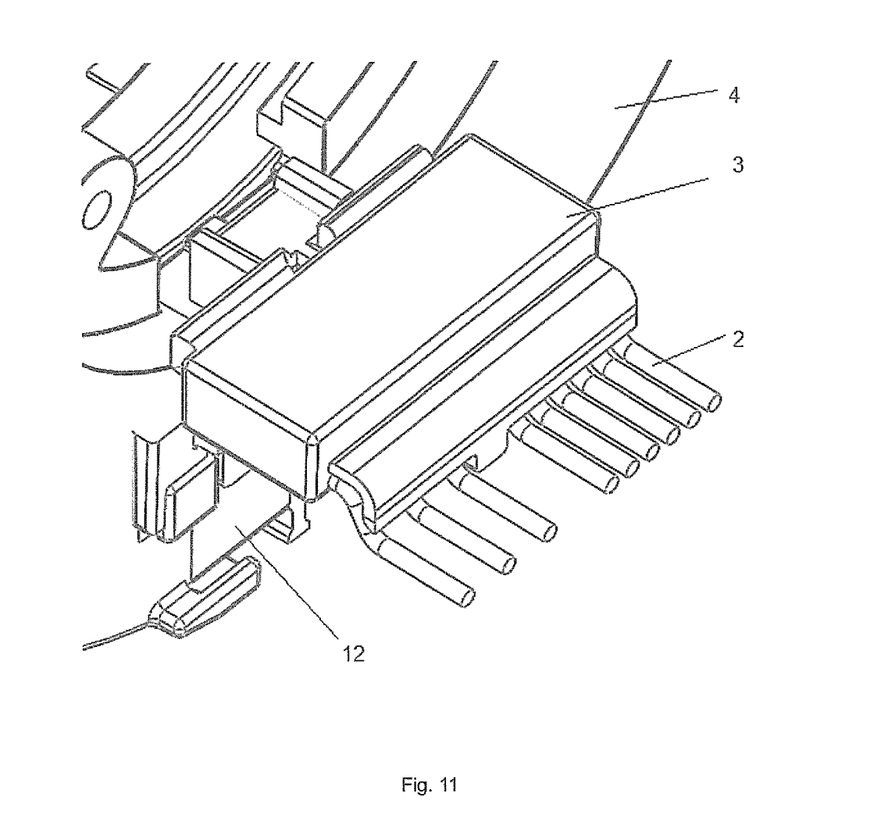
FIG. 11 shows a perspective view of the protection unit according to an embodiment of the present invention.
Figure 12:
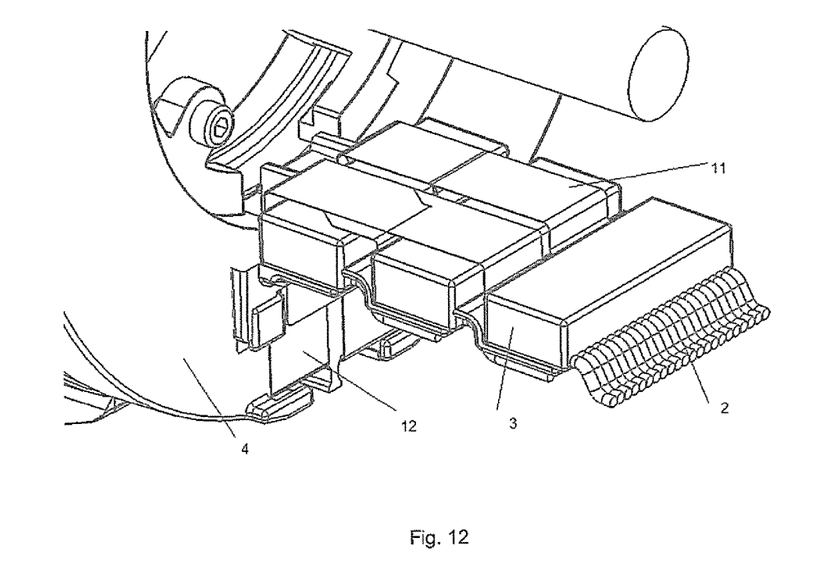
FIG. 12 shows a perspective view of the protection unit comprising a plurality FPC boards according to an embodiment of the present invention.

The protective unit 3 may comprise a plurality of plastic boards 32, which substantially horizontal to each other and vertical to the wiring unit 4, thereby a plurality of the end portion of the FPC boards 11 are apart from each other and capable of connecting to corresponding groups of cables 2, respectively.

Advantages of the System and Method According to this Invention

With these solutions, better protection for FPC could be archived:

(1) During assembly, strengthen force caused by plugging connectors and etc. will be applied on cables or plastic boards, rather than FPCs. And thus, FPC will not be torn out;

(2) The risk of the FPC cut out by sharp edge, burrs, and the like, could be minimized;

(3) The high voltage breakdown between FPC and surrounding metallic parts could be avoided.

So, the assembly procedure of robot with FPC inside will be similar to the traditional ones, and no special care should be taken.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the disclosure includes all novel and non-obvious combinations and sub-combinations of the various elements, features, functions and/or properties disclosed herein. Similarly, recitation in the disclosure and/or the claims of "a" or "a first" element, or the equivalent thereof, should be understood to include incorporation of one or more such elements, neither requiring nor excluding two or more such elements.

It is believed that the following claims particularly point out certain combinations and sub-combinations that are directed to one of the disclosed inventions and are novel and non-obvious. Inventions embodied in other combinations and sub-combinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

Therefore, it is to be understood that the embodiments of the invention are not to be limited to the specific embodiments disclosed and that modifications and other embodiments are intended to be included within the scope of the appended claims. Although specific terms are used herein, they are used in a generic and descriptive sense only and not for purposes of limitation.

The invention claimed is:

1. A rotary joint, comprising a wiring unit having a main portion associated with each of a plurality of flexible printed circuit (FPC) boards therein, wherein said rotary joint further comprising a protective unit fixed to said wiring unit, in which an end portion of each of said plurality of FPC boards is connected to a group of cables;
wherein said protective unit comprises a plurality of plastic boards, which substantially parallel or horizontal to each other, thereby said end portion of each of said plurality of FPC boards are apart from each other and capable of connecting to corresponding groups of cables, respectively.

2. The rotary joint according to claim 1, wherein said end portion of each of said plurality of FPC boards is fixed to said protective unit.

3. The rotary joint according to claim 2, wherein said protective unit comprises a connecting member which is coupled to the plurality of plastic boards, said connecting member fixed to said wiring unit, said plurality of plastic boards being fixed to said end portion of each of said plurality of FPC boards.

4. The rotary joint according to claim 3, wherein said connecting member has a box like shape without an upper surface, being capable of accommodating said plastic boards, and having an opening on a side surface for said cables to pass through.

5. The rotary joint according to claim 3, wherein the end portion of said plurality of plastic boards is an arc like shape.

6. The rotary joint according to claim 3, wherein said protective unit further comprises one or more screws and/or one or more snap hooks, thereby fixing said plurality of plastic boards to said connecting member.

7. The rotary joint according to claim 3, wherein said plurality of plastic boards are vertical or inclined to said wiring unit.

8. The rotary joint according to claim 3, wherein said cables are soldered to said end portion of each of said plurality of FPC boards, a protection membrane and/or a reinforcement membrane being put on the area where said cables soldered, said protection membrane and/or reinforcement membrane being fixed to said plurality of plastic boards.

9. The rotary joint according to claim 8, wherein said protection membrane is a kind of glue.

10. The rotary joint according to claim 3, wherein a soft or hard reinforcing layer is on one or two sides of each of said plurality of FPC boards, said reinforcing layer being fixed to each of said plurality of plastic boards.

11. The rotary joint according to claim 10, wherein said reinforcing layer is partly or completely fixed on each of said plurality of FPC boards by adhesive or tape.

12. The rotary joint according to claim 1, wherein said protective unit further comprises one or more clamps, to fix said cables to said protective unit.

13. The rotary joint according to claim 1, wherein said protective unit further comprises one or more knots inside said protective unit, to prevent said cables from being pulled out.

14. The rotary joint according to claim 1, wherein said protective unit further comprises melt adhesive filled into said protective unit.

15. The rotary joint according to claim 1, wherein said wiring unit comprises a first rotation member and a second rotation member rotatable relative to each other, and a first portion of said main portion of each of said plurality of FPC boards is connected to said first rotation member and a second portion of said main portion of each of said plurality of FPC boards is connected to said second rotation member.

16. The rotary joint according to claim 15, wherein said first rotation member is provided with a hole, and said first portion of said main portion of each of said plurality of FPC boards is wound around the hole loosely enough to allow said first portion of said main portion of each of said plurality of FPC boards to move relative to said second portion of said main portion of said FPC board.

17. An robot comprising a rotary joint including a wiring unit having a main portion associated with each of a plurality of flexible printed circuit (FPC) boards therein, wherein said rotary joint further comprising a protective unit fixed to said wiring unit, in which an end portion of each of said FPC boards is connected to a group of cables, wherein said protective unit comprises a plurality of plastic boards, which substantially parallel or horizontal to each other, thereby a plurality of said end portion of each of said FPC boards are apart from each other and capable of connecting to corresponding groups of cables, respectively.

18. The robot according to claim 17, wherein said end portion of each of said plurality of FPC boards is fixed to said protective unit.

19. The robot according to claim 18, wherein said protective unit comprises a connecting member which is coupled to the plurality of plastic boards, said connecting member fixed to said wiring unit, said plurality of plastic boards being fixed to said end portion of each of said plurality of FPC boards.

20. A rotary joint, comprising a wiring unit having a main portion of a flexible printed circuit (FPC) board therein, wherein said rotary joint further comprising a protective unit fixed to said wiring unit, in which an end portion of said FPC board is connected to a group of cables,
wherein said end portion of said FPC board is fixed to said protective unit;
wherein said protective unit comprises a connecting member and a plastic board coupling to each other, said connecting member fixed to said wiring unit, said plastic board being fixed to said end portion of said FPC board; and
wherein said protective unit further comprises one or more screws and/or one or more snap hooks, thereby fixing said plastic board to said connecting member.

* * * * *